United States Patent [19]

Sasaki et al.

[11] Patent Number: 5,250,462
[45] Date of Patent: Oct. 5, 1993

[54] METHOD FOR FABRICATING AN OPTICAL SEMICONDUCTOR DEVICE

[75] Inventors: Tatsuya Sasaki; Ikuo Mito; Tomoaki Katoh, all of Tokyo, Japan

[73] Assignee: NEC Corporation, Tokyo, Japan

[21] Appl. No.: 750,172

[22] Filed: Aug. 26, 1991

[30] Foreign Application Priority Data

Aug. 24, 1990 [JP] Japan .................. 2-222928
Apr. 1, 1991 [JP] Japan .................. 3-67498

[51] Int. Cl.$^5$ ........................... H01L 21/20
[52] U.S. Cl. .................. 437/89; 437/129; 148/DIG. 26
[58] Field of Search ............ 437/89, 126, 129, 133; 148/DIG. 26

[56] References Cited

U.S. PATENT DOCUMENTS 4,826,784  5/1989  Salerno et al. .................. 437/126
4,948,751  8/1990  Okamoto et al. ............ 148/DIG. 26

FOREIGN PATENT DOCUMENTS 388733  9/1990  European Pat. Off. .............. 437/89

104687  5/1986  Japan .
144385  6/1987  Japan .

OTHER PUBLICATIONS

Patent Abstract of JP-A-62 144 385.
Patent Abstract of JP-A-61 104 687.

*Primary Examiner*—Brian E. Hearn
*Assistant Examiner*—Linda J. Fleck
*Attorney, Agent, or Firm*—Sughrue, Mion, Zinn, Macpeak & Seas

[57] ABSTRACT

A method for fabricating an optical semiconductor device includes the steps of forming at least two stripes of dielectric parallel to each other with a predetermined interval on a semiconductor substrate, growing a crystal selectively between the two stripes, and forming a multi-layer structure which is required to have a width determined by the crystal grown between the two stripes. In such a method, the width of the multi-layer structure including an active layer or a waveguide is controlled precisely, because there is no step of etching a semiconductor layer, so that the characteristics of the device may improve and the yield may increase.

7 Claims, 13 Drawing Sheets

- 4 SECOND CLAD LAYER
- 3 ACTIVE LAYER
- 8 FIRST CLAD LAYER
- 1 SUBSTRATE

- 21 SiO₂ LAYER

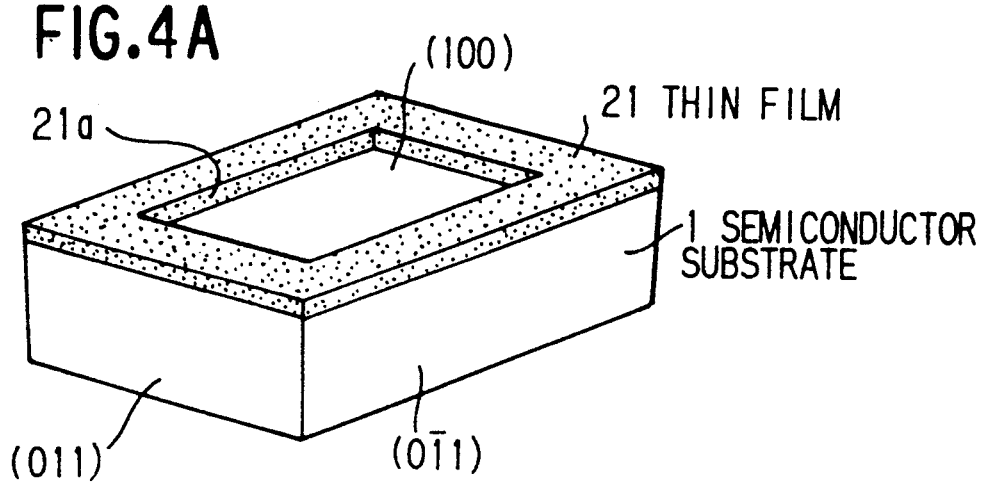
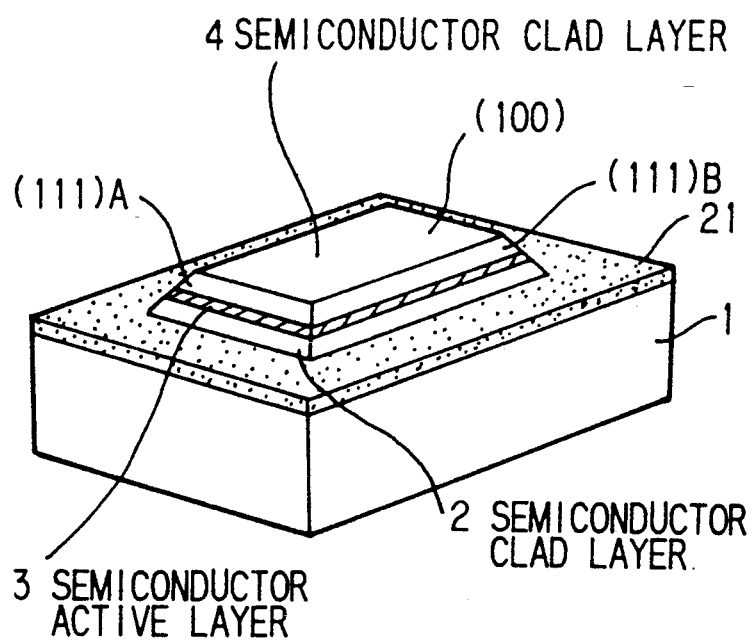

7 p-InGaAs CAP LAYER
6 p-InP CLAD LAYER

22

32 p-ELECTRODE 33 n-ELECTRODE

- 3 MQW ACTIVE LAYER
- 4 p-InP CLAD LAYER
- 2 n-InP CLAD LAYER

- 6 p-InP CLAD LAYER
- 7 p-InGaAs CAP LAYER

METHOD FOR FABRICATING AN OPTICAL SEMICONDUCTOR DEVICE

FIELD OF THE INVENTION

This invention relates to a method for fabricating an optical semiconductor device, and more particularly to, a method for fabricating an optical semiconductor device such as a single semiconductor laser, a combination of a semiconductor laser and a semiconductor optical modulator or a waveguide integrated in a common semiconductor substrate used in an optical communication system, an optical information processing system, etc.

BACKGROUND OF THE INVENTION

An optical semiconductor device such as a semiconductor laser used in an optical communication system or an optical information processing system has been required to have higher performances as well as to be fabricated with a low cost for public use. Accordingly, it is necessary to fabricate such an optical semiconductor device from a large size semiconductor wafer with a high yield. In order to meet these requirements, the optical semiconductor device is fabricated by a process in which crystal growth is carried out by vapor phase epitaxy such as metalorganic vapor phase epitaxy (MOVPE) by which epitaxial growth is realized in a large area with high uniformity. Such a vapor phase epitaxy enables the fabrication of a semiconductor laser of quantum well structure having characteristics such as a low threshold and high efficiency of operation or narrow spectrum operation.

In a first conventional method for fabricating an optical semiconductor device, a double-hetero (DH) structure consisting of an n-InP clad layer, an InGaAsP active layer and a p-InP clad layer is formed on an n-InP substrate. Then, an $SiO_2$ layer is formed on the p-InP clad layer, and patterned to be stripes each having a width of 2 μm. Then, the DH structure is mesa-etched, except for the area which is masked by the $SiO_2$ layer, until the surface of the n-InP substrate is exposed. The width of the remaining active layer thus experienced the mesa-etching becomes 1.5 μm, which enables the foundamental transverse mode to be kept stable. Then, p-InP and n-InP buried layers are deposited in this order on the exposed surface of the n-InP substrate to stuff the grooves formed by the mesa-etching on both sides of the remaining double-hetero structure. Finally, after removing the $SiO_2$ layer, a p-InP layer and a $p^+$-InGaAs cap layer are deposited in this order to cover the fabricated surface of the n-InP substrate.

In a second conventional method for fabricating an optical semiconductor device, a DH structure consisting of a first clad layer, an active layer and a second clad layer is formed on a substrate. Then, an $SiO_2$ layer is formed and patterned to be stripes each having a predetermined width. Then, the DH structure is mesa-etched, except for the area which is masked by the $SiO_2$ layer, until the surface of the n-InP substrate exposes. Then, after removing the $SiO_2$ layer, a third clad layer and a cap layer are deposited in this order to cover the fabricated surface of the n-InP substrate including the DH structure. Finally, a high resistance region is formed on both sides of the DH structure by implanting protons to confine a current flowing within the DH structure.

On the other hand, there is a great demand for an integrated optical semiconductor device such as one including a distributed feedback (DFB) semiconductor laser and a semiconductor optical modulator with narrow spectrum at high speed modulation or one including a distributed Bragg reflection (DBR) semiconductor with variable wavelength.

In a third conventional method for fabricating an optical semiconductor device, a grating is formed only within the DBR region on the surface of an n-InP substrate. Then, an n-InGaAsP guide layer, an active layer, a p-InP clad layer are deposited in this order.

Then, the p-InP clad layer and the InGaAsP active layer in all of the regions, except for the active region are removed with using an $SiO_2$ layer as a mask. Then, an InGaAsP waveguide layer and a p-InP clad layer are grown selectively on a predetermined region. Then, the fabricated surface of the n-InP substrate, except for the areas forming the elements, are mesa-etched with using an $SiO_2$ layer as a mask. Then, an Fe-doped high resistance InP layer and an n-InP layer are grown to be buried. Then, after removing the $SiO_2$ layer, a p-InP layer and a $p^+$-InGaAs cap layer are grown. Then, grooves for insulation are formed between the laser and waveguide regions, and between the adjacent semiconductor lasers. Then, an $SiO_2$ layer is deposited on throughout the fabricated surface of the n-InP substrate. Then, after forming openings of the $SiO_2$ above the waveguide areas of the modulator, DBR, phase adjusting and active regions, and p-electrodes are formed to connect the waveguide areas thereof through the openings, while an n-electrode is formed on the back surface of the substrate.

According to the first to third conventional methods for fabricating an optical semiconductor device, however, there is a disadvantage in that it is difficult to control width of waveguides or active layers precisely, because the conventional methods include the steps of semiconductor etching using an $SiO_2$ layer as a mask.

In semiconductor etching such as mesa-etching, the thickness of the semiconductor can be controlled precisely, however, the width thereof varies because of variation of the mesa structure of occurrence of side etching. Variation of width of the active layer or waveguide may affect the characteristics of the device such as the threshold current, oscillation wavelength or beampattern. Consequently, such a variation of the width thereof may cause yield reduction or outranging of designed operation.

Furthermore, in the fabrication, it is required to match the location of the active layer with that of the waveguide, so that the steps of etching and growth of buried layers become complex and have problems in uniformity and reproducibility which affect characteristics of the device and yield in fabrication.

SUMMARY OF THE INVENTION

Accordingly, it is an object of the invention to provide a method for fabricating an optical semiconductor device in which width of an active layer or a waveguide is controlled precisely.

According to a feature of the invention, a method for fabricating an optical semiconductor device comprises the steps of:

forming a dielectric layer on a semiconductor substrate;

patterning the dielectric layer to be at least two stripes parallel to each other with a predetermined interval;

growing a crystal selectively on the semiconductor substrate using the stripes of the dielectric layer as a mask; and forming a multi-layer structure which is required to have a predetermined width determined by a width of the crystal grown between the two stripes.

BRIEF DESCRIPTION OF THE DRAWINGS

The invention will be explained in more detail in conjunction with appended drawings wherein:

FIGS. 4A and 4B are perspective views of a structure of a crystal growth substrate and a growth crystal in explaining a basic principle of the invention;

DESCRIPTION OF THE PREFERRED EMBODIMENTS

Before describing a method for fabricating an optical semiconductor device in the preferred embodiments according to the invention, the conventional methods for fabricating an optical semiconductor device described before will be explained.

Figure 1A:
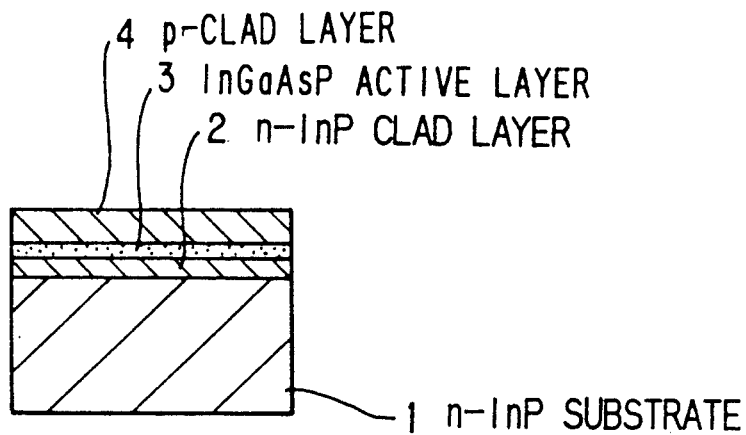
FIGS. 1A to 1E are cross-sectional views illustrating a semiconductor laser during various stages of fabrication according to a first conventional method for fabricating an optical semiconductor device.
Figure 1B:
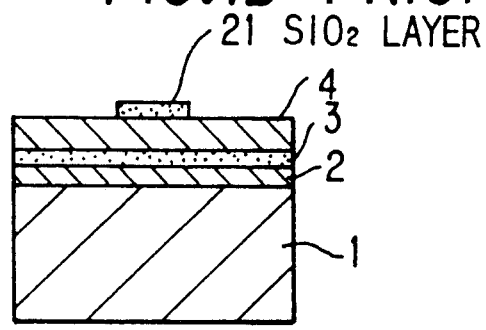
Figure 1C:
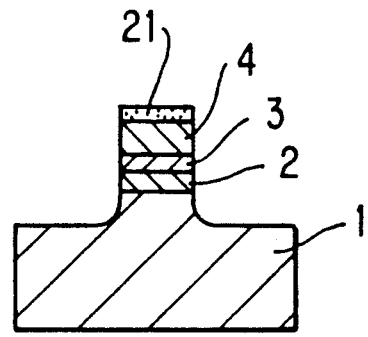
Figure 1D:
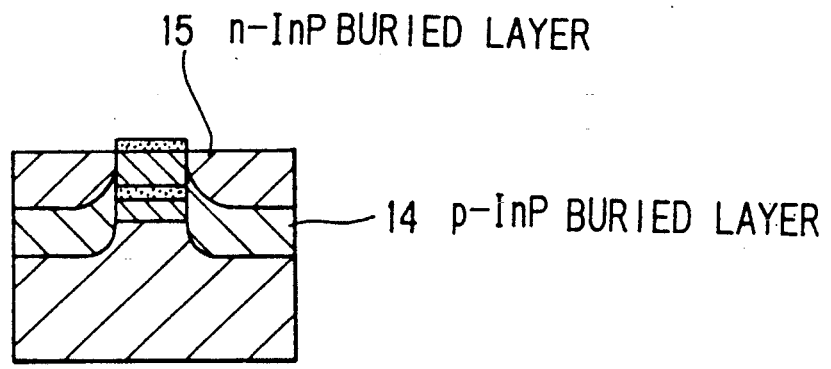
Figure 1E:
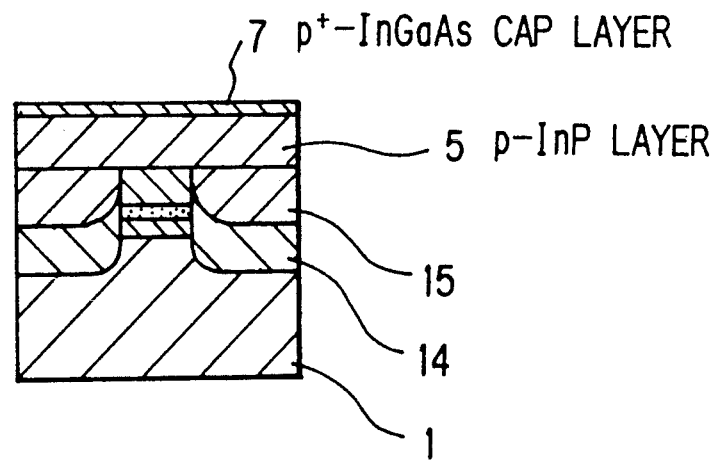

First, the first conventional method for fabricating an optical semiconductor device by MOVPE will be explained in conjunction with FIGS. 1A to 1E. In the first conventional method for fabricating an optical semiconductor device, a double-hetero (DH) structure consisting of an n-InP clad layer 2, an InGaAsP active layer 3 and a p-InP clad layer 4 is formed on an n-InP substrate 1, as shown in FIG. 1A. Then, an $SiO_2$ layer 21 is formed on the p-InP clad layer 4, and patterned to be stripes each having a width of 2 μm, as shown in FIG. 1B. Then, the DH structure is mesa-etched, except for the area which is masked by the $SiO_2$ layer 21, until the surface of the n-InP substrate 1 exposes, as shown in FIG. 1C. The width of the remaining active layer 3 having thus experienced the mesa-etching beomes 1.5 μm, which enables the foundamental transverse mode to be kept stable. Then, p-InP and n-InP buried layers 14 and 15 are deposited in this order on the exposed surface of the n-InP substrate 1 to stuff the grooves formed by the mesa-etching on both sides of the remaining double-hetero structure, as shown in FIG. 1D. Finally, after removing the $SiO_2$ layer 21, a p-InP layer 5 and a $p^+$-InGaAs cap layer 7 are deposited in this order selectively to cover the fabricated surface of the n-InP substrate 1, as shown in FIG. 1E.

Figure 2A:
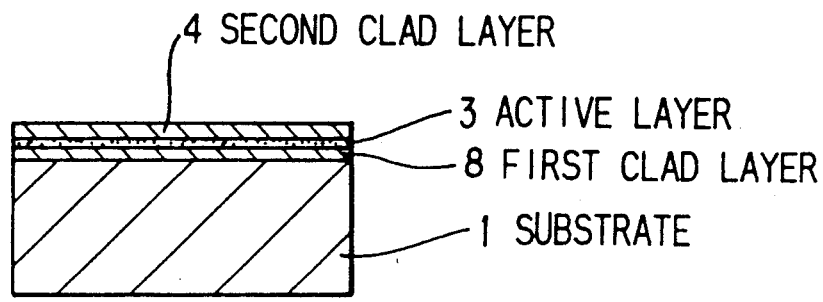
FIGS. 2A to 2E are cross-sectional views illustrating a semiconductor laser during various stages of fabrication according to a second conventional method for fabricating an optical semiconductor device.
Figure 2B:
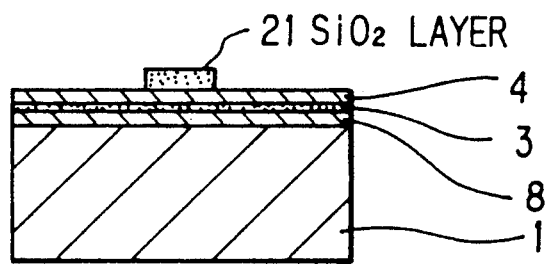
Figure 2C:
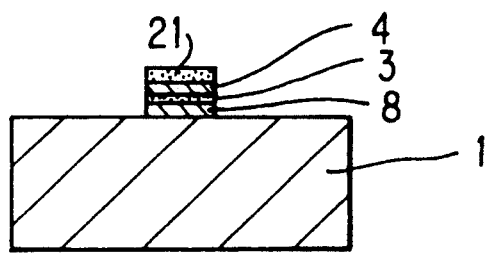
Figure 2D:
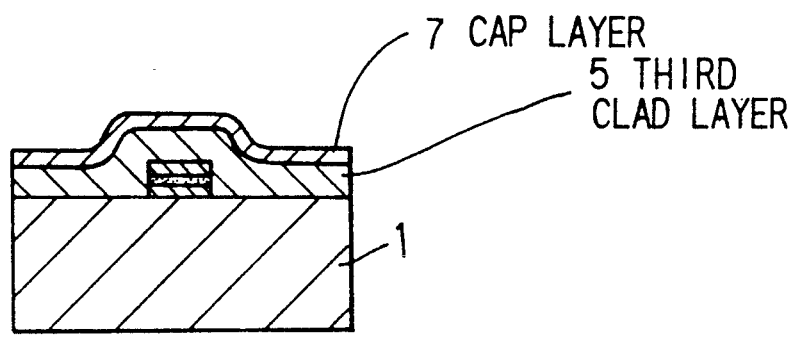
Figure 2E:
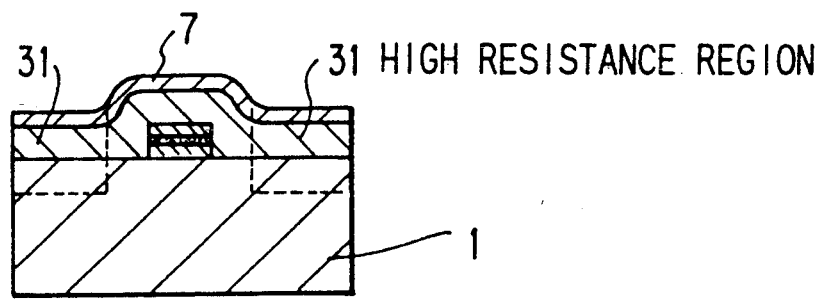

Next, the second conventional method for fabricating an optical semiconductor device will be explained in conjunction with FIGS. 2A to 2E. In the second conventional method for fabricating an optical semiconductor device, a DH structure consisting of a first clad layer 8, an active layer 3 and a second clad layer 4 is formed on a substrate 1, as shown in FIG. 2A. Then, an $SiO_2$ layer 21 is formed and patterned to be stripes each having a predetermined width, as shown in FIG. 2B. Then, the DH structure is mesa-etched, except for the area which is masked by the $SiO_2$ layer 21, until the surface of the n-InP substrate 1 exposes, as shown in FIG. 2C. Then, after removing the $SiO_2$ layer 21, a third clad layer 5 and a cap layer 7 are deposited in this order to cover the fabricated surface of the n-InP substrate 1 including the DH structure, as shown in FIG. 2D. Finally, a high resistance region 31 is formed on both sides of the DH structure by implanting protons to confine a current flowing within the DH structure, as shown in FIG. 2E.

Figure 3:
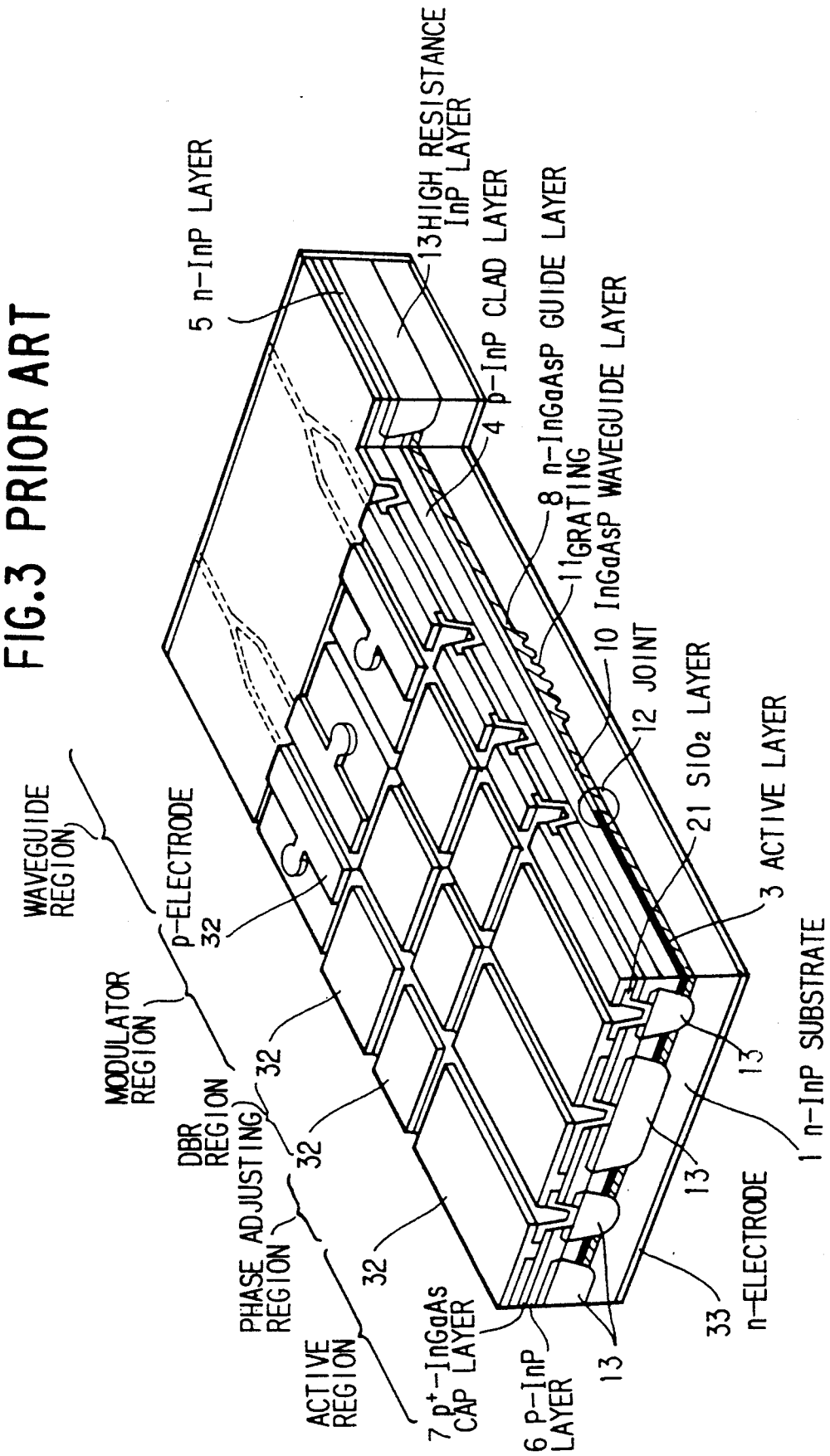
FIG. 3 is a perspective view illustrating an integrated optical waveguide device fabricated by a third conventional method for fabricating an optical semiconductor device.

Next, the third conventional method for fabricating an optical semiconductor device will be explained in conjunction with FIG. 3. The integrated optical waveguide device includes four wavelength variable semiconductor lasers, four semiconductor optical modulators and two optical waveguides having four terminals connected with the four modulators to provide four parallel lasing and modulating structures. Each of the four wavelength variable semiconductor laser is a three-electrode DBR laser including an active region, a phase adjusting region and a DBR region. An active layer 3 is formed only in the active region, while a waveguide layer 10 is formed commonly in the phase adjusting region, the DBR region, the modulator region and the waveguide region. The active layer 3 and the waveguide layer 10 are connected with each other at a joint 12. The active layer 3 and the waveguide layer 10 are both mesa-etched to be a stripe having a width of approximately 1.5 μm. A high resistance InP layer 13 is formed to be buried between adjacent two of the four parallel structures for confinement of a current flowing within each of the structures and isolation therebetween.

In the third conventional method for fabricating an optical semiconductor device, a grating 11 is formed only within the DBR region on the surface of an n-InP substrate 1. Then, an n-InGaAsP guide layer 8, an active layer 3, a p-InP clad layer 4 are deposited in this order. Then, the p-InP clad layer 4 and the InGaAsP active layer 3 is all of the regions but the active region are removed with using and $SiO_2$ layer as a mask. Then, the InGaAsP waveguide layer 10 and the p-InP clad layer 4 are grown selectively on the predetermined region. Then, the fabricated surface of the n-InP substrate 1 but the areas forming the elements are mesa-etched with using an $SiO_2$ layer as a mask. Then, and Fe-doped high resistance InP layer 13 and an n-InP layer 5 are grown to be buried. Then, after removing the SiO$_2$ layer, a p-InP layer 6 and a P$^+$-InGaAs cap layer 7 are grown. Then, grooves for insulation are formed between the laser and waveguide regions, and between the adjacent semiconductor lasers. Then, an SiO$_2$ layer 21 is deposited in throughout the fabricated surface of the substrate 1. Then, after forming openings of the SiO$_2$ above the waveguide areas of the modulator, DBR, phase adjusting and active regions, p-electrodes 32 are formed to connect the waveguide areas thereof through the openings, while an n-electrodes 33 is formed on the back surface of the n-InP substrate 1. The growths are carried out by metalorganic vapor phase epitaxy (MOVPE).

Next, the basic principle of the invention will be explained in conjunction with FIGS. 4A and 4B. In FIG. 4A, a thin film 21 for selective growth is formed on (100) surface of a semiconductor substrate 1. Then, the thin film 21 is selectively removed to be stripes having side walls 21a parallel to [0$\bar{1}$1] or [011] direction. Then, a DH structure consisting of a first clad layer 2, an active layer 3 and a second clad layer 4 are formed by MOVPE, as shown in FIG. 4B.

In such a case, the DH structure has facets of (111) A surface in [0$\bar{1}$1] direction and (111) B surface in [011] direction. Additionally, all of the layers composing the DH structure have very flat top surfaces of (100). The mixed crystal compositions of the layers are uniform within each surface so far as the stripe width of the thin film 21 is not too large, so that such a layer thus formed can be used as an active layer or a waveguide layer. As explained above, each of the layers has facets of (111), so that width of the layers can be controlled precisely so far as patterning of an SiO$_2$ layer as a mask is carried out precisely. In the selective growth, it is possible to cover facets of the active layer with an upper clad layer during the growth thereof, so that it is possible to fabricate a semiconductor laser having superior characteristics of little interface recombination composition, controllability and reproducibility.

In this method for fabricating an optical semiconductor device, a p-InP clad layer and a p$^+$-InGaAs cap layer are formed by selective growth, and the method does not include etching of semiconductor layers, which causes several problems, though it includes patterning of dielectric thin films such as an SiO$_2$ layer and selective growth. Therefore, optical semiconductor devices are fabricated from a large size semiconductor wafer by a batch growth process having superior performances such as uniformity or reproducibility due to selective growth of an active layer.

Next, the relation between width of SiO$_2$ stripe-shaped layer as a mask and growth rate of semiconductor layers will be explained. In this MOVPE selective growth, the growth rate becomes large as the width of the SiO$_2$ stripe becomes large, and the composition of III-group element such as In depends on the width thereof if the semiconductor layer to be grown is a mixed crystal semiconductor. Such an analysis has been reported by Y. D. Galeuchet et al on pages 147 to 150 of Journal of Crystal Growth 107 (1991) and by J. Finders et al on pages 151 to 155 thereof.

Figure 5:
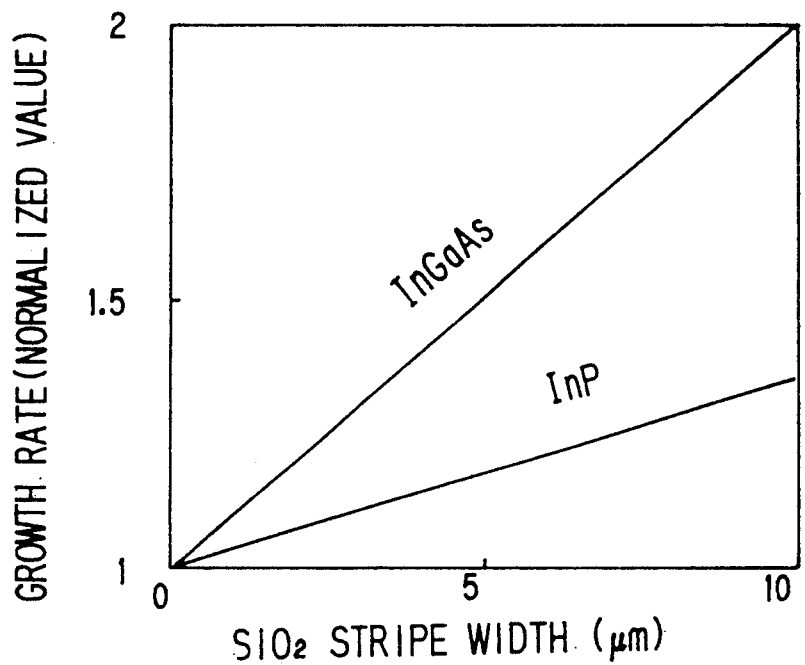
FIG. 5 is a graph showing a relation between in $SiO_2$ stripe width and a growth rate.
Figure 6:
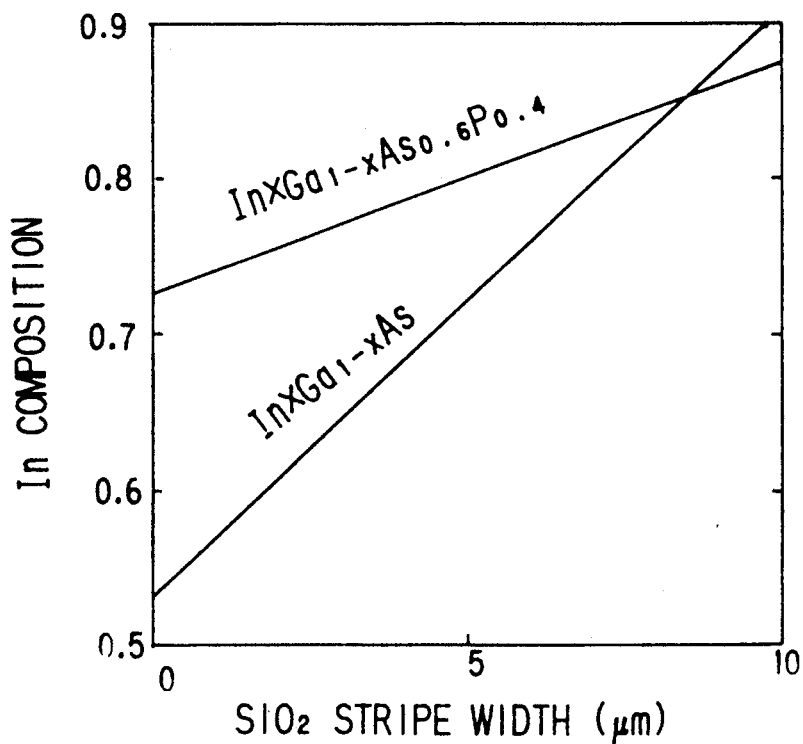
FIG. 6 is a graph showing a relation between an $SiO_2$ stripe width and the composition ratio of In in the crystal.

FIG. 5 shows a relation between the SiO$_2$ stripe width and a growth rate in case of InP and InGaAs, while FIG. 6 shows a relation between the SiO$_2$ stripe width and the composition ratio of In in the mixed crystal of In$_x$Ga$_{1-x}$As and In$_x$Ga$_{1-x}$As$_{0.6}$P$_{0.4}$ in which a light having a wavelength of 1.3 $\mu$m is emitted. The growth rate of the semiconductor layer becomes large as the width of the SiO$_2$ stripe becomes large, because the growth source materials which are diffused in lateral direction along the SiO$_2$ layer to reach the semiconductor surface becomes large in amount as the width thereof becomes large. The In ratio in the composition of the mixed crystal becomes large as the width thereof becomes large, because the source material of In diffuses in lateral direction easier than that of Ga.

Therefore, in selective growth of quantum well structure using InGaAs or InGaAsP as a well, a thickness of the well becomes large and the lattice distortion (compressive stress) is applied to the well so that amount of In in the composition of the mixed crystal composing the well by widening the SiO$_2$ stripe. Consequently, the transition energy of the quantum well structure becomes small.

Figure 7:
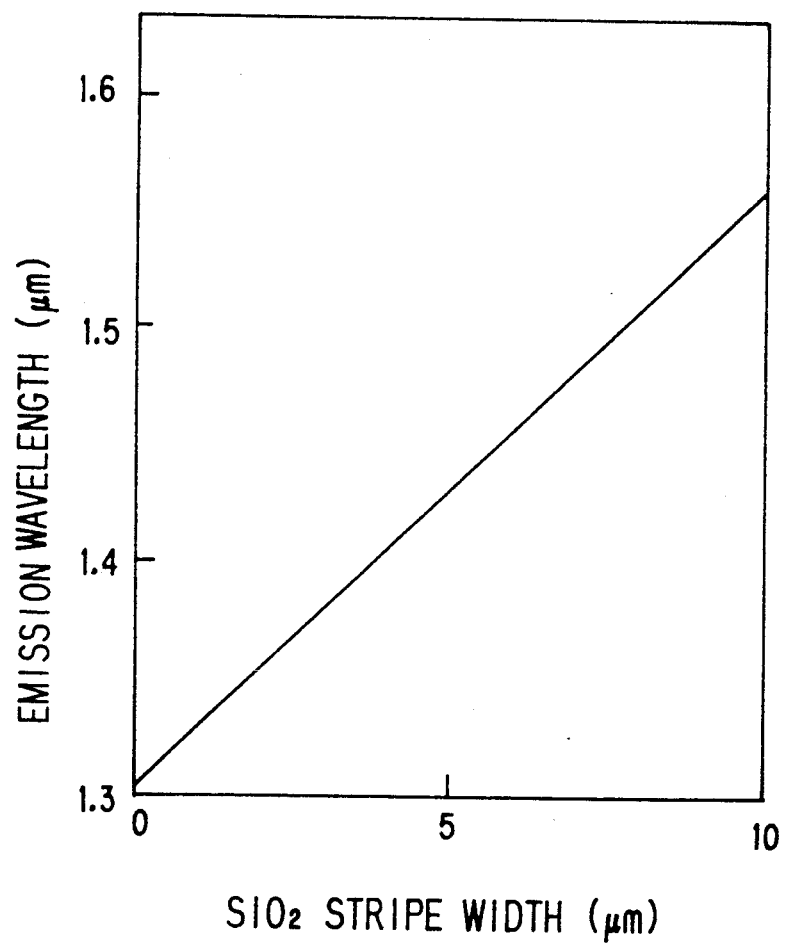
FIG. 7 is a graph showing a relation between an $SiO_2$ stripe width and an emission wavelength.

FIG. 7 shows a relation between an SiO$_2$ stripe width and an emission wavelength of the selectively grown layer in case of multi-quantum well (MQW) structure including In$_x$Ga$_{1-x}$As well and In$_x$Ga$_{1-x}$As$_y$P$_{1-y}$ barrier selectively grown. The wavelength becomes long as the width of the SiO$_2$ stripe becomes large. In practical, the wavelengths become approximately 1.4 $\mu$m and 1.55 $\mu$m when the widths are approximately 4 $\mu$m and 10 $\mu$m, respectively. Therefore, a semiconductor laser emitting a light having a wavelength of 1.55 $\mu$m and a waveguide layer transmitting a light having a wavelength of 1.3 $\mu$m can be fabricated simultaneously by the same process by determining the widths of the semiconductor laser and the waveguide layer so as to have a predetermined ratio. In other words, a laser oscillating region in the direction parallel to a waveguide and a waveguide region which is transparent against the light can be fabricated by use of crystal growth.

Next, a method for fabricating an optical semiconductor device in a first preferred embodiment according to the invention will be explained in conjunction with FIGS. 8A to 8F.

Figure 8A:
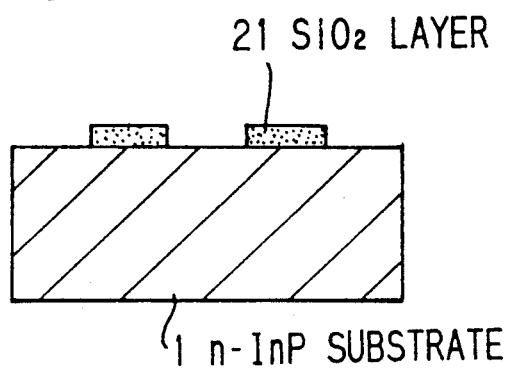
FIGS. 8A to 8F are cross-sectional views illustrating a semiconductor laser during various stages of fabrication according to a method for fabricating an optical semiconductor device in a first preferred embodiment according to the invention.
Figure 8B:
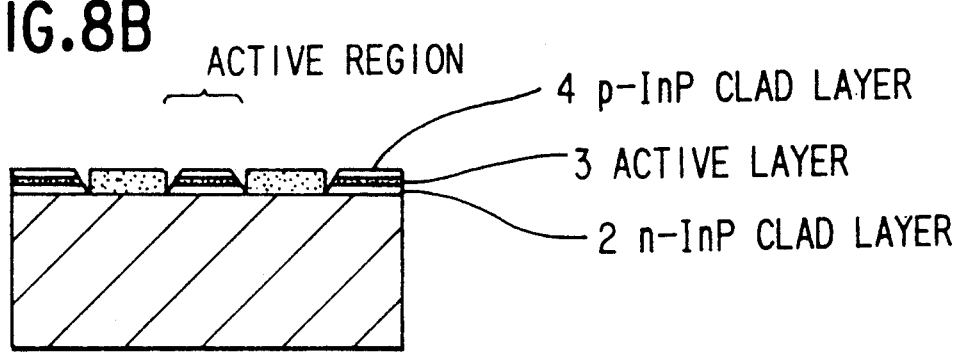
Figure 8C:
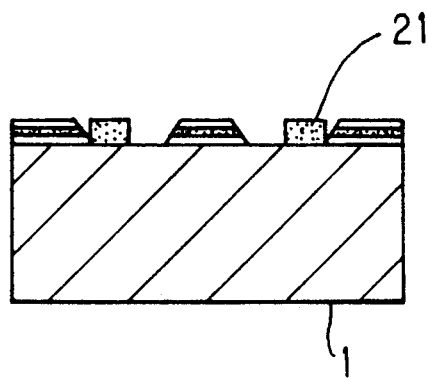
Figure 8D:
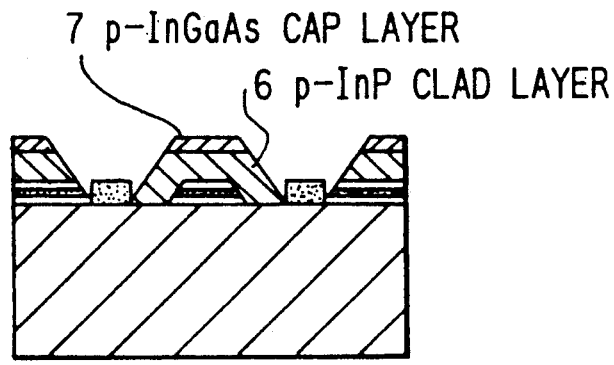
Figure 8E:
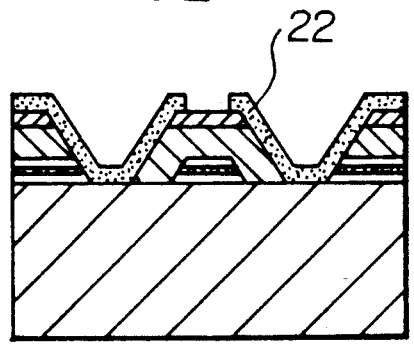
Figure 8F:
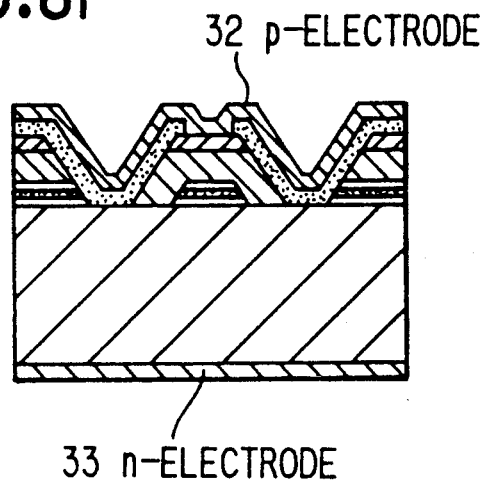

First, an SiO$_2$ layer 21 having a thickness of approximately 2000 Å is deposited on (100) surface of an n-InP substrate 1 by chemical vapor deposition (CVD). Then, the SiO$_2$ layer 21 is patterned by photolithography to form two stripes each having a width of 10 $\mu$m with an interval of 1.8 $\mu$m, as shown in FIG. 8A. Then, an Si-doped n-InP clad layer 2 having a thickness of 1000 Å and a carrier concentration of $1 \times 10^{18}$ cm$^{-3}$, an InGaAsP active layer 3 having a thickness of 800 Å and the composition corresponding to a wavelength of 1.55 $\mu$m, and a Zn-doped p-InP clad layer 4 having a thickness of 500 Å and a carrier concentration of $5 \times 10^{17}$ cm$^{-3}$ are selectively grown in this order to form a DH structure on the surface of the n-InP substrate 1 along the SiO$_2$ layer 21 and between the adjacent SiO$_2$ layers 21, as shown in FIG. 8B. The thicknesses of the layers shown above are measured at the area between the two SiO$_2$ stripes 21 corresponding to an active region, and the thicknesses thereof are uniform in the active region. Then, the SiO$_2$ layers 21 are removed as wide as 10 $\mu$m setting removing center line at a center line of the active region, as shown in FIG. 8C. Then, a p-InP clad layer 6 having a thickness of 1.5 $\mu$m and a carrier concentration of $5 \times 10^{17}$ cm$^{-3}$ and a p$^+$-InGaAs cap layer 7 having a thickness of 0.3 $\mu$m and a carrier concentration of $1 \times 10^{19}$ cm$^{-3}$ are selectively grown in this order in the area between the two remaining SiO$_2$ layers 21. Then, after removing the SiO$_2$ layers 21, a second SiO$_2$ layer 22 is formed on throughout the fabricated surface of the n-InP substrate 1, and the second SiO$_2$ layer 22 is etched to have a stripe of opening above the active region, as shown in FIG. 8E. Finally, a p-electrode 32 is formed to connect with the active region through the stripe opening, while an n-electrode 33 is formed on a back surface of the n-InP substrate 1, as shown in FIG. 8F.

Investigation of characteristics of the semiconductor laser thus fabricated is carried out in case of a cavity length of 300 $\mu$m to obtain results of an average threshold current of 10.2 mA with standard deviation of 0.2 mA and an average slope efficiency of 0.23 W/A with standard deviation of 0.04 W/A. The average width of the active layer is 1.52 $\mu$m with standard deviation of 0.12 $\mu$m. Such a result shows that the semiconductor laser fabricated by the first preferred embodiment has almost the same characteristics as those of the semiconductor laser fabricated by the conventional fabrication method as shown in FIG. 1 or 2, and distribution of values of the characteristics becomes narrow.

In the preferred embodiment, a bulk InGaAsP is used for an active layer, however, an MQW structure may be used instead of the bulk layer to improve the characteristics thereof throughly. A p-type substrate may be used instead of an n-type substrate used in the embodiment. In this case, a conduction type of each of layers becomes reversed one as compared with that in the embodiment.

Next, a method for fabricating an optical semiconductor device in a second preferred embodiment according to the invention will be explained in conjunction with FIGS. 9A to 9F.

Figure 9A:
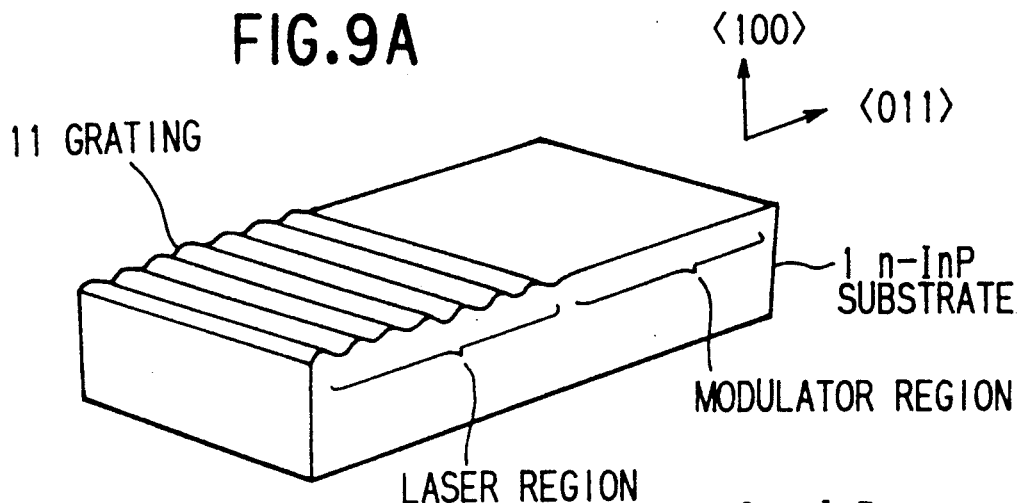
FIGS. 9A to 9F are cross-sectional views illustrating an integrated optical device during various stages of fabrication according to a method for fabricating an optical semiconductor device in a second preferred embodiment according to the invention.
Figure 9B:
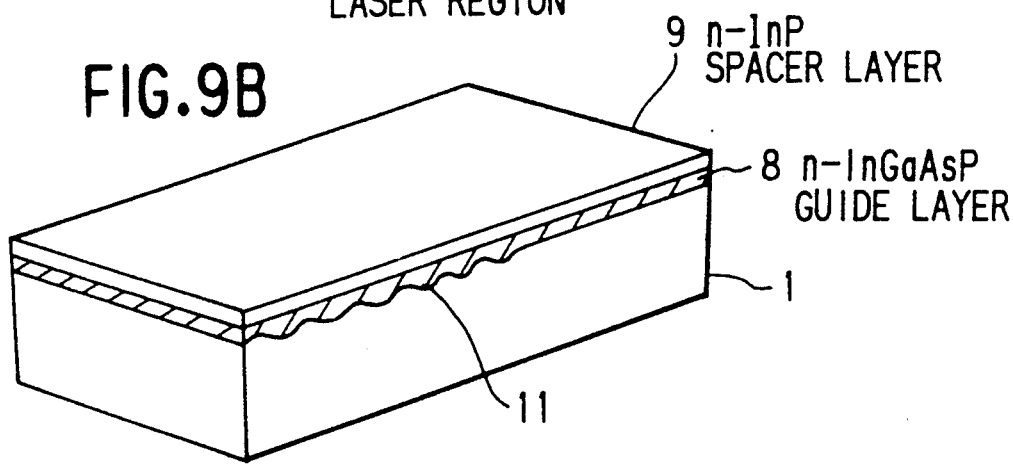
Figure 9C:
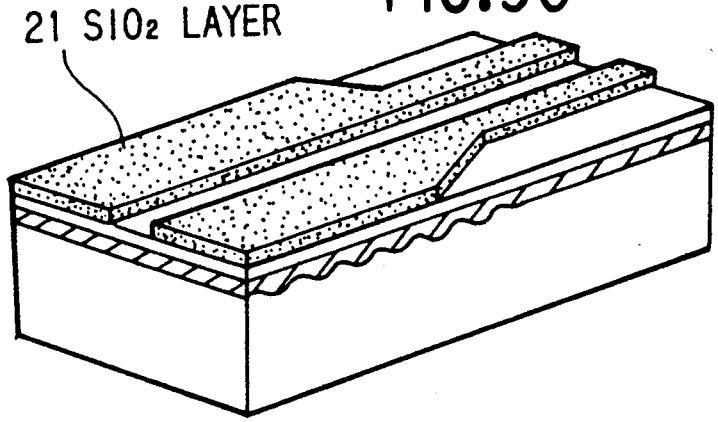
Figure 9D:
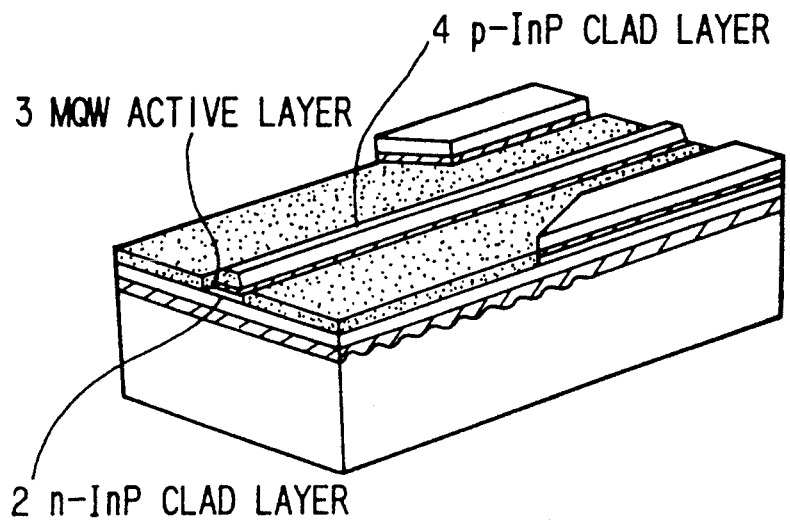
Figure 9E:
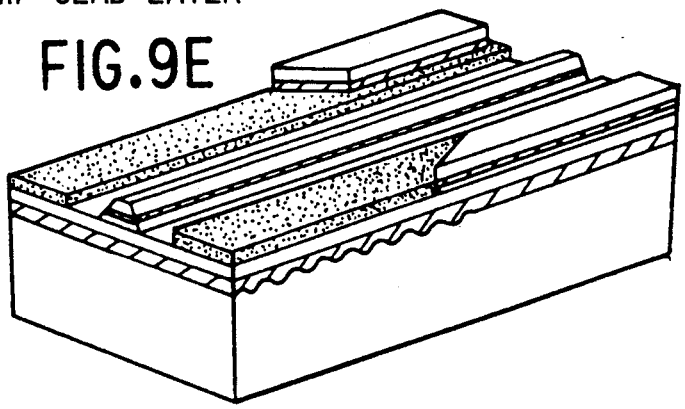
Figure 9F:
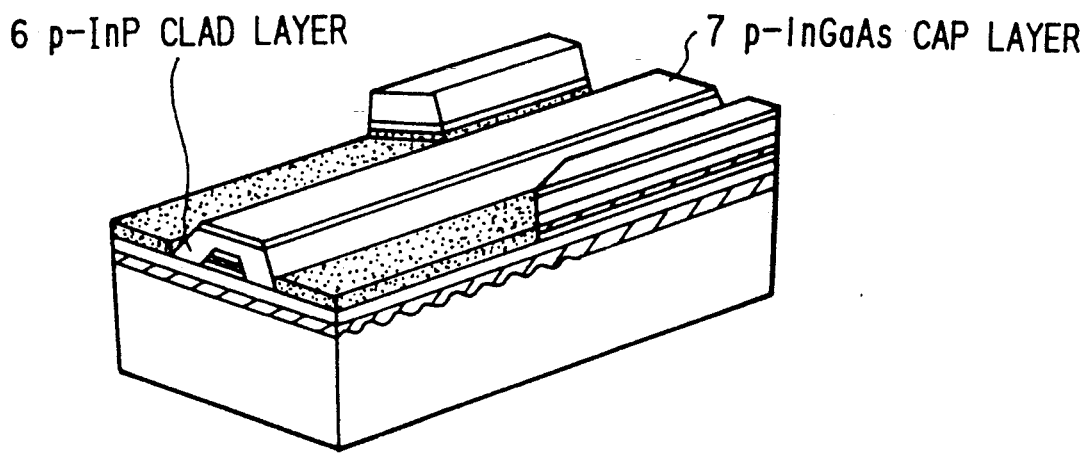

First, a grating (diffraction lattice) 11 in the direction of [011] is formed only within a laser region on (100) surface of an n-InP substrate 1, as shown in FIG. 9A. Then, an n-InGaAsP guide layer 8 having the composition corresponding to a wavelength of 1.3 $\mu$m, a carrier concentration of $1 \times 10^{18}$ cm$^{-3}$ and a thickness of 1000 Å and an n-InP spacer layer 9 having a carrier concentration of $1 \times 10^{18}$ cm$^{-3}$ and a thickness of 500 Å are grown in this order on the n-InP substrate 1, as shown in FIG. 9B. Then, an SiO$_2$ layer 21 is formed on the n-InP spacer layer 9, and the SiO$_2$ layer 21 is patterned to be a pair of stripes parallel each other with an interval of 2 $\mu$m and each having a width of 10 $\mu$m in the laser region and 6 $\mu$m in the modulator region, as shown in FIG. 9C. Each of the stripes has a transition width of 20 $\mu$m. Then, an n-InP clad layer 2 having a carrier concentration of $1 \times 10^{18}$ cm$^{-3}$ and a thickness of 500 Å, an MQW active layer 3, and a p-InP clad layer 4 having a carrier concentration of $5 \times 10^{17}$ cm$^{-3}$ and a thickness of 500 Å are selectively grown in this order using the stripes of the SiO$_2$ layers 21 as masks to form a waveguide region, as shown in FIG. 9D. The MQW active layer 3 has an MQW structure including a well of InGaAs and a barrier of InGaAsP and having a well number of 4. It is noted that the growth condition of the layers are set so that the well and the barrier are both lattice matched with the n-InP substrate 1 in the active region and thicknesses of the well and the barrier become respectively 75 Å and 150 Å. As a result, the emission wavelength becomes 1.56 $\mu$m in the active region and 1.48 $\mu$m in the modulator region. Then, the SiO$_2$ layers 21 are removed on both sides of the waveguide region to have stripe shaped openings having a width of 2 $\mu$m, as shown in FIG. 9E. Then, a p-InP clad layer 6 having a carrier concentration of $5 \times 10^{17}$ cm$^{-3}$ and a thickness of 1.5 $\mu$m and a p$^+$—InGaAs cap layer 7 having a thickness of 0.3 $\mu$m and a carrier concentration of $1 \times 10^{19}$ cm$^{-3}$ are selectively grown in this order, as shown in FIG. 9F. Then, an SiO$_2$ layer is formed on all over the fabricated surface of the n-InP substrate 1, and the SiO$_2$ layer is removed to form a stripe shaped opening having a width of 20 $\mu$m above the laser region and the modulator region. Then, the p$^+$—InGaAs cap layer 7 is removed in the area between the laser and modulator regions by etching to make isolation therebetween. Finally, pad-shaped p-electrodes are formed on the fabricated surface to connect with the laser and modulator regions through the openings, while an n-electrode is formed on the back surface of the n-InP substrate 1. The laser region length having a cleavage surface is 500 $\mu$m and the modulator region length is 200 $\mu$m.

Investigation of characteristics of the integrated optical device thus fabricated is carried out. In a typical one of the integrated optical devices, the oscillation threshold current is 20 mA and the maximum CW optical output from the modulator is 30 mW. The oscillation wavelength is 1.55 $\mu$m, and the extinction ratio is 20 dB when the modulator region is applied with a voltage of $-3$ V. The coupling efficiency estimated by the extinction characteristic is found to be as large as 98%. The isolation resistance between the laser and modulator regions is 50 k$\Omega$. Any of 20 samples in random selected from the fabricated devices has the extinction ratio not smaller than 15 dB on condition of being applied with $-5$ V.

Figure 10:
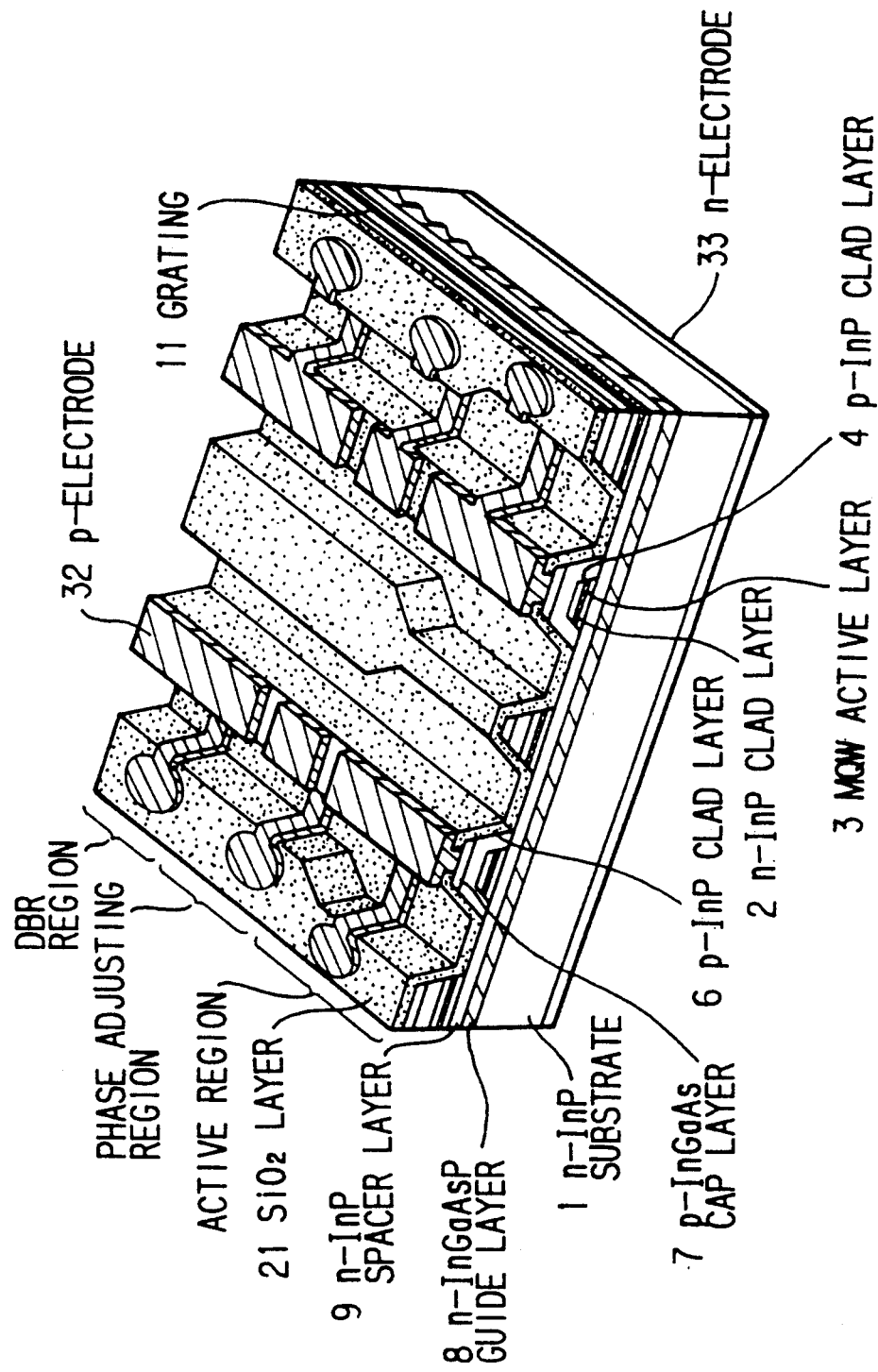
FIG. 10 is a perspective view illustrating a semiconductor laser fabricated by a method for fabricating an optical semiconductor device in a third preferred embodiment according to the invention.

Next, a method for fabricating an optical semiconductor device in a third preferred embodiment according to the invention will be explained in conjunction with FIG. 10.

First, a grating 11 is formed only within a DBR region on an n-InP substrate 1. Then, an n-InGaAsP guide layer 8 having the composition corresponding to 1.3 $\mu$m, a carrier concentration of $1 \times 10^{18}$ cm$^{-3}$ and a thickness of approximately 1000 Å, and an n-InP spacer layer 9 having a carrier concentration of $1 \times 10^{18}$ cm$^{-3}$ and a thickness of approximately 500 Å are grown in this order. Then, an SiO$_2$ layer is formed on the n-InP spacer layer 9, and the SiO$_2$ layer is patterned to be a pair of stripes parallel each other with an interval of 2 $\mu$m and each having a width of 10 $\mu$m in the active region and 4 $\mu$m in both the phase adjusting region and the DBR region. Each of the stripes has a transition wdth of 20 $\mu$m. Then, an n-InP clad layer 2 having a carrier concentration of $1 \times 10^{18}$ cm$^{-3}$ and a thickness of 500 Å, an MQW active layer 3, and a p-InP clad layer 4 having a carrier concentration of $5 \times 10^{17}$ cm$^{-3}$ and a thickness of 500 Å are selectively grown in this order using the stripes of the SiO$_2$ layers as masks to form a waveguide region. The MQW active layer 3 has an MQW structure including a well of InGaAs and a barrier of InGaAsP and having a well number of 4. It is noted that the growth condition of the layers are set so that the well and the barrier are both lattice matched with the n-InP substrate 1 in the active region and thicknesses of the well and the barrier become respectively 75 Å and 150 Å. As a result, the emission wavelength becomes 1.56 $\mu$m in the active region and approximately 1.4 $\mu$m in both the phase adjusting region and the DBR region. Then, the SiO$_2$ layers are removed in both sides of the waveguide region to have stripe shaped openings having a width of 2 $\mu$m. Then, a p-InP clad layer 6 having a carrier concentration of $5 \times 10^{17}$ cm$^{-3}$ and a thickness of 1.5 $\mu$m and a p$^+$-InGaAs cap layer 7 having a thickness of 0.3 μm and a carrier concentration of $1 \times 10^{19}$ cm$^{-3}$ are selectively grown in this order. Then, an SiO$_2$ layer is formed on all over the fabricated surface of the n-InP substrate 1, and the SiO$_2$ layer is removed to form a stripe shaped opening having a width of 20 μm. Then, the p$^+$-InGaAs cap layer 7 is removed in the area between the regions by etching to make isolation therebetween. Finally, pad-shaped p-electrodes 32 are formed on the fabricated surface, while an n-electrode is formed on the back surface of the n-InP substrate 1. The active region length having a cleavage surface is 500 μm, the phase adjusting region length is 150 μm and the DBR region length is 300 μm. The distance between the waveguides is 600 μm, and an irradiation facet of the DBR region is coated with an anti-reflection film.

Investigation of characteristics of the DBR semiconductor array thus fabricated is carried out after being cut into each structure of 4 channels. In a typical one of the 4-channel DBR semiconductor arrays, the oscillation threshold current is 18 mA. The oscillation wavelength of 4 channels is 1.553 μm±0.003 μm when a current is injected into only the active region. It is confirmed that the DBR semiconductor array operates in a single mode until an optical output becomes as large as 30 mW. It is possible to obtain a wide range of the wavelength variable not narrower than 5 nm in each channel with keeping the optical output to be 5 mW by injecting a current to the phase adjusting and DBR regions.

In the second and third preferred embodiments, the current confinement structure may be replaced by one using proton implantation method instead of the selective growth.

Although the invention has been described with respect to specific embodiment for complete and clear disclosure, the appended claims are not limited thereto and may include alternative constructions that may occur to one skilled in the art which fairly fall within the basic teaching set forth herein.

What is claimed is:

1. A method for fabricating an optical semiconductor device, comprising the steps of:
    forming a dielectric layer on a semiconductor substrate, said dielectric layer being formed as two dielectric stripes which are parallel to each other and defining a predetermined interval therebetween;
    growing a crystal selectively on said semiconductor substrate, using said dielectric stripes as a mask, to form a multi layer structure having a width which is determined by said predetermined interval;
    etching portions of said dielectric stripes to change the size of said predetermined interval; and
    selectively growing an additional crystal between said predetermined interval after said etching step.

2. A method for fabricating an optical semiconductor device, comprising the steps of:
    forming a dielectric layer on a semiconductor substrate, said dielectric layer being formed as two dielectric stripes which are parallel to each other and defining a predetermined interval therebetween;
    growing a crystal selectively on said semiconductor substrate, using said dielectric stripes as a mask, to form a multi layer structure having a width which is determined by said predetermined interval;
    etching a portion of each of said dielectric stripes which faces the other of said dielectric stripes to expose a portion of the surface of said dielectric substrate; and
    growing a crystal selectively to form a clad layer on said semiconductor substrate on at least the area between said two dielectric stripes as etched.

3. A method for fabricating an optical semiconductor device, according to claim 2;
    wherein said steps of growing a crystal is carried out by metalorganic vapor phase epitaxy.

4. A method for fabricating an optical semiconductor device, according to claim 2:
    wherein said step of forming a dielectric layer is a step of forming an SiO$_2$ layer.

5. A method for fabricating an optical semiconductor device, according to claim 2:
    wherein said multi-layer structure includes a layer selected from a group consisting of an active layer and a waveguide layer.

6. A method for fabricating an optical semiconductor device, comprising the steps of:
    forming first and second regions on a semiconductor crystal substrate, said first region having a surface having diffraction lattices and said second region having a flat surface;
    forming a multi-layer semiconductor substrate including a semiconductor guide layer on said fabricated surface of said semiconductor crystal substrate;
    forming at least two stripes of dielectric layer sandwiching an optical waveguide region on said multi-layer semiconductor substrate, said stripes extending parallel to each other with a predetermined interval therebetween and each of said stripes having a width which is wider in said first region and is narrower in said second region;
    forming a multi-layer semiconductor layer including an active layer by selective growth on a surface of said multi-layer semiconductor substrate including said optical waveguide region; and
    forming a semiconductor laser and a semiconductor optical modulator in said first and second regions, respectively.

7. A method for fabricating an optical semiconductor device, comprising the steps of:
    forming first to third regions on a semiconductor crystal substrate, each of said first and second regions having a flat surface and said third region having a surface having diffraction lattices;
    forming a multi-layer semiconductor substrate including a semiconductor guide layer on said fabricated surface of said semiconductor crystal substrate;
    forming at least two stripes of dielectric layer sandwiching an optical waveguide region on said multi-layer semiconductor substrate, said stripes extending parallel to each other with a predetermined interval therebetween and each of said stripes having a width which is wider in said first region and is narrow and the same in said second and third regions;
    forming a multi-layer semiconductor layer including an active layer by selective growth on a surface of said multi-layer semiconductor substrate including said optical waveguide region; and
    forming a light emission unit, a phase control unit and a wavelength variable braggy reflector in said first to third regions, respectively.

* * * * *